(12) United States Patent
Matsubara et al.

(10) Patent No.: US 6,621,171 B2
(45) Date of Patent: Sep. 16, 2003

(54) SEMICONDUCTOR DEVICE HAVING A WIRE LAID BETWEEN PADS

(75) Inventors: Toshiyuki Matsubara, Tokyo (JP); Hideo Matsui, Tokyo (JP); Hiroki Takahashi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/171,599

(22) Filed: Jun. 17, 2002

(65) Prior Publication Data

US 2003/0132532 A1 Jul. 17, 2003

(30) Foreign Application Priority Data

Jan. 15, 2002 (JP) ......................... 2002-005920

(51) Int. Cl.[7] ......................... H01L 23/48; H01L 23/52; H01L 29/40

(52) U.S. Cl. ......................... 257/784; 257/776
(58) Field of Search ......................... 281/758, 751, 281/765, 770, 771, 773, 784, 782, 786, 776, 666, 667, 687, 690, 692, 787, 774; 174/50, 52.2, 52.4, 50.52, 59

Primary Examiner—Wael Fahmy
Assistant Examiner—Dana Farahani
(74) Attorney, Agent, or Firm—Oblon, Spivak, McClelland, Maier & Neustadt, P.C.

(57) ABSTRACT

It is intended to lower an increase of an area of an unused area or a wiring area, which is caused due to addition or enhancement of a particular function of a semiconductor device without significantly changing layout of the semiconductor device which has been previously designed. A semiconductor device (100A) has a layout in which a wiring area (102) is surrounded by an extension block (103) as a second semiconductor region and is completely sandwiched between a block (101) and the extension block (103). A plurality of wires (104) are laid across the wiring area (102) only at a single position between two adjacent ones of a plurality of pads (102a) in the wiring area (102), to connect a CPU (201c) in the block (101) and each of a ROM (301), a RAM (302) and an A/D converter (303) in the extension block (103) with each other.

12 Claims, 6 Drawing Sheets

SEMICONDUCTOR DEVICE HAVING A WIRE LAID BETWEEN PADS

BACKGROUND OF THE INVENTION

1. Field of the Invention

The present invention relates to a technique for layout of a circuit in a semiconductor device.

2. Description of the Background Art

FIG. 10 shows a layout of a conventional semiconductor device 200A. A block 201 is surrounded by a wiring area 202 and includes a RAM (random access memory) 201a, a ROM (read only memory) 201b, a CPU (central processing unit) 201c and a peripheral circuit 201d. A plurality of bonding pads 202a are arranged in the wiring area 202, to be connected to the foregoing components in the block 201 by wires not shown.

FIG. 11 shows a layout of another conventional semiconductor device 200B having a greater storage capacity than that of the semiconductor device 200A. The semiconductor device 200B differs from the semiconductor device 200A in that the RAM 201a and the ROM 201b of the device 200A are replaced with a RAM 201d and a ROM 201e, respectively. The RAM 201d and the ROM 201e are respectively greater than the RAM 201a and the ROM 201b in storage capacity and thus in occupying area in the layout.

As generally known, a RAM or ROM having a greater storage capacity occupies a greater area. In accordance with conventional practices, when it becomes necessary to increase the storage capacity of the semiconductor device 200A which has already been designed, the semiconductor device 200B in which the area of the block 201 is increased while keeping the rectangular shape thereof is newly designed. In such case, the semiconductor device 200B would unavoidably include an unused area in the block 201 which is larger than an unused area in the block 201 of the semiconductor device 200A by an area 500 as shown in FIG. 11. Further, the increase of the area of the block 201 itself results in an increase of the area of the wiring area 202 surrounding the block 201.

SUMMARY OF THE INVENTION

In order to solve the above-noted problems, it is therefore an object of the present invention to lower an increase of unused area or wiring area in a semiconductor device, which is caused due to addition or enhancement of a function of the semiconductor device without significantly changing a layout of the device which has been previously designed.

A semiconductor device according to the present invention includes a first semiconductor region, a second semiconductor region, a wiring area and at least one wire. In the first semiconductor region, at least one first circuit is placed. In the second semiconductor region, at least one second circuit connected to the at least one first circuit is placed. The wiring area includes a plurality of pads connected to the at least one first circuit and surrounds the first semiconductor region. The at least one wire is laid across said wiring area at a single position between two adjacent ones of the plurality of pads per portion of the wiring area which is sandwiched between the first and second semiconductor regions. The at least one wire connects the at least one first circuit and the at least one second circuit to each other.

There is no need for significantly changing a layout of the first semiconductor region when the second circuit is further provided in addition to the first circuit, position of which has already been determined in the first semiconductor region. This lowers an increase of the area of the first semiconductor region as well as an increase of the area of the wiring area surrounding the first semiconductor region. Further, the wire is laid across the wiring area at a single position per portion sandwiched between the first and second semiconductor regions. This also lowers the increase of the area of the first semiconductor region, and suppresses characteristics variation of the first semiconductor region which is likely to occur if the second semiconductor region is modified in many ways.

Preferably, the at least one wire is electrically broken while no request for access to the second circuit from the first circuit is present.

It is possible to avoid a situation in which although access to the second circuit is unnecessary, a wire capacitance is unwantedly applied to the first circuit. This improves an operation speed of the first circuit of the semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred Embodiments

<First Preferred Embodiment>

Figure 1:
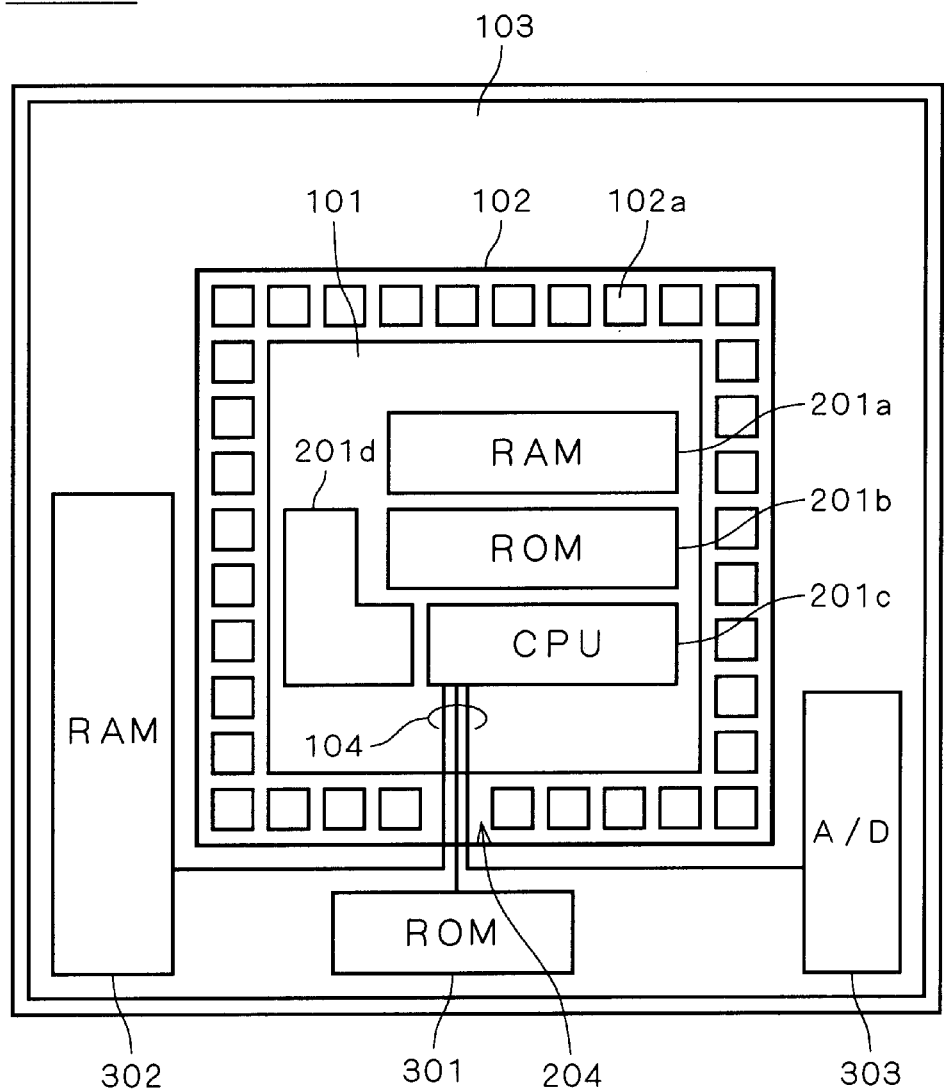
FIG. 1 illustrates a layout of a semiconductor device according to a first preferred embodiment of the present invention.

FIG. 1 shows a layout of a semiconductor device 100A according to a first preferred embodiment of the present invention. In a block 101 as a first semiconductor region, the RAM 201a, the ROM 201b, the CPU 201c and the peripheral circuit 201d are placed in the same manner as in the block 201 of the conventional device. The block 101 has a substantially quadrangled shape such as a substantially rectangular shape, for example. Also, in an extension block 103 as a second semiconductor region, a ROM 301, a RAM 302 and an A/D converter 303 which are to be connected with the CPU 201c are placed.

A wiring area 102 surrounding the block 101 is provided, which includes a plurality of pads 102a arranged therein. The plurality of pads 102a are connected with circuits placed in the block 101 (which will be hereinafter referred to as "first circuits") such as the CPU 201 and the peripheral circuit 201d, for example, via wires not shown. The pads 102a are further connected with any element or circuit not shown which is provided outside the semiconductor device 100A. Thus, the pads 102a function as relaying points for electrically connecting the circuits placed in the block 101 to the outside of the semiconductor device 100A.

The layout of the semiconductor device 100A is such that the wiring area 102 is surrounded by the extension block 103 as the second semiconductor region and is completely sandwiched between the block 101 and the extension block 103. Further, plural wires 104 are laid across the wiring area 102 only at a single position therein between two adjacent ones out of the pads 102a, to connect the CPU 201c and each of the ROM 301, the RAM 302 and the A/D converter 303.

The foregoing layout of the semiconductor device 100A according to the first preferred embodiment eliminates a need for significantly changing a layout of the block 101 in further providing the ROM 301, the RAM 302 and the A/D converter 303 in addition to the RAM 201a, the ROM 201b, the CPU 201c and the peripheral circuit 201d, positions of which have already been determined in the block 101. As a result, it is possible to lower an increase of the area of the block 101 or the wiring area 102 surrounding the block 101, which areas would considerably increase by the conventional practices, in increasing the storage capacity of the semiconductor device 100A.

Further, the manner of laying the wires 104 which are laid across the wiring area 102 only at a single position therein is effective in lowering the increase of the area of the block 101. Moreover, the manner of the laying the wires 104 allows for suppression of characteristics variation of the block 101 even if the extension block 103 is modified in many ways.

Additionally, each of the block 101 and the extension block 103 may include only a single circuit. Further, not the plural wires 104 but a single wire 104 may be alternatively laid.

<Second Preferred Embodiment>

Figure 2:
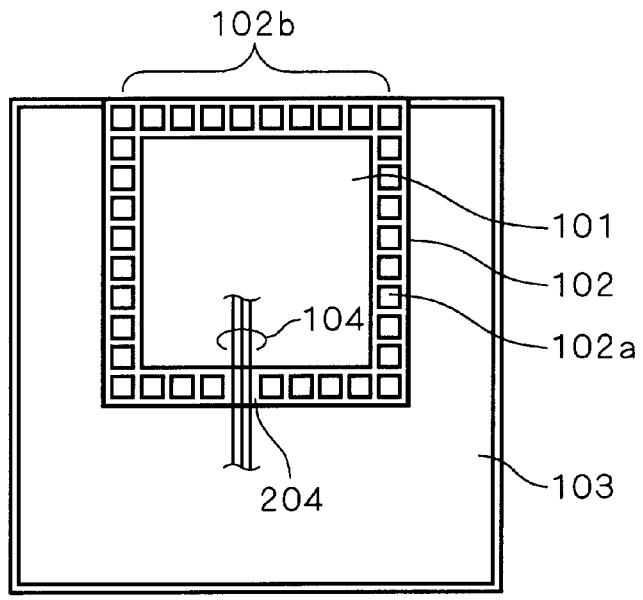
FIG. 2 illustrates a layout of a semiconductor device according to a second preferred embodiment of the present invention.

FIG. 2 shows a layout of a semiconductor device 100B according to a second preferred embodiment of the present invention. In FIG. 2, the first circuits including the RAM 201a, the ROM 201b and the CPU 201c, and circuits placed in the extension block 103 (which will be hereinafter referred to as "second circuits") such as the peripheral circuit 201d, the ROM 301, the RAM 302 and the A/D converter 303 (see FIG. 1) are not shown for purposes of simplification.

The layout of the semiconductor device 100B is such that only three sides of the block 101 having a substantially rectangular shape face the extension block 103 with the wiring area 102 interposed therebetween. In other words, a portion of the wiring area 102 is sandwiched between the block 101 and the extension block 103 such that the sandwiched portion is substantially U-shaped. Further, the wires 104 are laid across the wiring area 102 only at the single position 204 which is located within the portion of the wiring area 102 sandwiched between the block 101 and the extension block 103.

It is noted that in FIG. 2, each pad out of the pads 102a located in a portion of the wiring area 102 which is not sandwiched between the block 101 and the extension block 103 is denoted by a reference numeral 102b, in distinction from the other pads 102a located in the sandwiched portion of the wiring area 102. The pad 102b is configured so as to have a function of receiving an external input signal such as an analog input, for example. By having the pad 102b receive an external input signal, the length of a wire extending from the outside of the device to the circuit placed in the block 101 is reduced as compared with a structure where an external input signal is received by the pads 102a.

Additionally, the position 204 can be determined anywhere in the wiring area 102, provided that the position 204 is located in a single space between two adjacent ones of the pads 102a within the portion of the wiring area 102 sandwiched between the block 101 and the extension block 103. For example, the position 204 can be determined within a portion of the wiring area 102 which portion extends along a longitudinal direction of the drawing.

<Third Preferred Embodiment>

Figure 3:
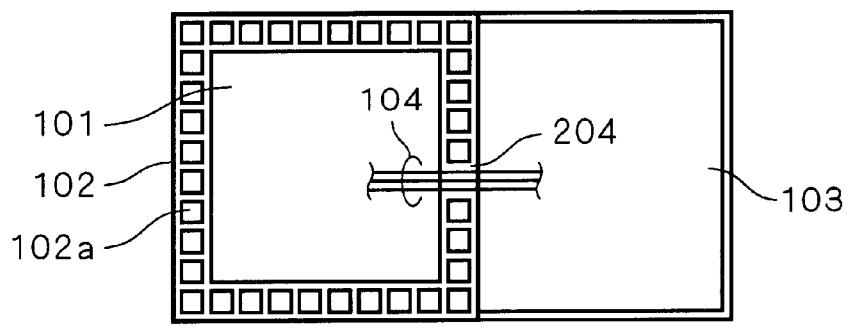
FIG. 3 illustrates a layout of a semiconductor device according to a third preferred embodiment of the present invention.

FIG. 3 illustrates a layout of a semiconductor device 100C according to a third preferred embodiment of the present invention. The first and second circuits are not shown for purposes of simplification in FIG. 3 as well.

The layout of the semiconductor device 100C is such that only one side of the block 101 having a substantially rectangular shape faces the extension block 103 with the wiring area 102 interposed therebetween. In other words, a portion of the wiring area 102 is sandwiched between the block 101 and the extension block 103 such that the sandwiched portion is substantially I-shaped. Further, the wires 104 are laid across the wiring area 102 only at the single position 204 which is located between two adjacent ones of the pads 102a within the portion of the wiring area 102 sandwiched between the block 101 and the extension block 103.

By placing the extension block 103 on only one side of the block 101, it is possible to reduce a load applied within the extension block 103 such as a wire capacitance, for example.

Additionally, each of the pads 102a located in a portion of the wiring area 102 not sandwiched between the block 101 and the extension block 103 may be configured so as to have a function of receiving an external input signal such as an analog input, for example, as described in the second preferred embodiment, of course.

<Fourth Preferred Embodiment>

Figure 4:
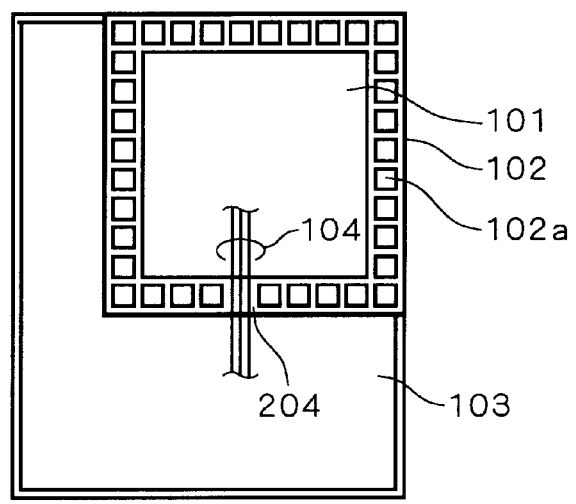
FIG. 4 illustrates a layout of a semiconductor device according to a fourth preferred embodiment of the present invention.

FIG. 4 shows a layout of a semiconductor device 100D according to a fourth preferred embodiment of the present invention. The first and second circuits are not shown for purposes of simplification in FIG. 4 as well.

The layout of the semiconductor device 100D is such that only two adjacent sides of the block 101 having a substantially rectangular shape face the extension block 103 with the wiring area 102 interposed therebetween. A portion of the wiring area 102 is sandwiched between the block 101 and the extension block 103 such that the sandwiched portion is substantially L-shaped. Further, the wires 104 are laid across the wiring area 102 only at the single position 204 which is located between two adjacent ones of the pads 102a within the portion of the wiring area 102 sandwiched between the block 101 and the extension block 103.

The fourth preferred embodiment makes it easier to shape the entire semiconductor device 100D like a square, which provides for increased productivity.

Additionally, each of the pads 102a located in a portion of the wiring area 102 not sandwiched between the block 101 and the extension block 103 may be configured so as to have a function of receiving an external input signal, as described in the second preferred embodiment, of course.

<Fifth Preferred Embodiment>

Figure 5:
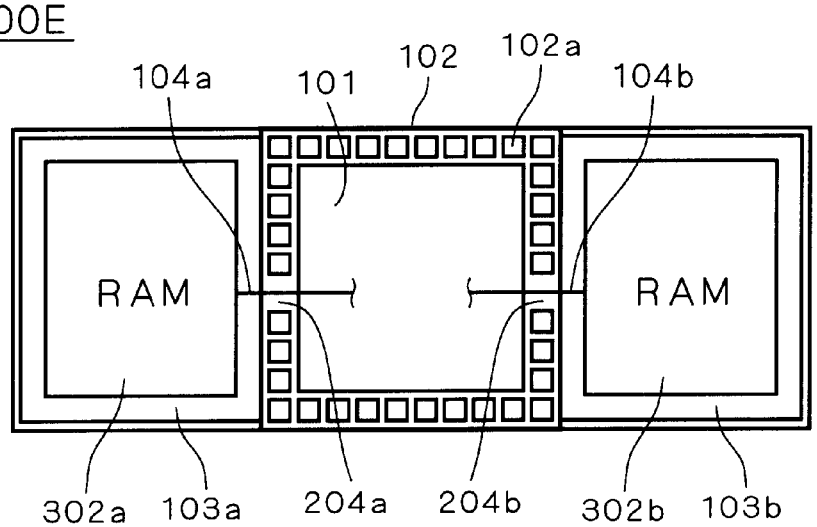
FIG. 5 illustrates a layout of a semiconductor device according to a fifth preferred embodiment of the present invention.

FIG. 5 shows a layout of a semiconductor device 100E according to a fifth preferred embodiment of the present invention. In FIG. 5, the first and second circuits except RAMs 302a and 302b each of which is one of the second circuits are not shown for purposes of simplification.

The RAMs 302a and 302b are placed in extension blocks 103a and 103b, respectively. The RAMs 302a and 302b are connected to the circuits not shown which are placed in the block 101 by wires 104a and 104b, respectively.

The layout of the semiconductor device 100E is such that only two sides of the block 101 having a substantially rectangular shape face the block 103a and 103b, respectively, with the wiring area 102 interposed therebetween. A portion of the wiring area 102 is sandwiched between the block 101 and the extension block 103a such that the sandwiched portion is substantially I-shaped, while another portion of the wiring area 102 is sandwiched between the block 101 and the extension block 103b such that the sandwiched portion is substantially I-shaped. These portions of the wiring area 102 face each other. Further, a single position 204a between two adjacent ones of the pads 102a within the portion of the wiring area 102 sandwiched between the block 101 and the extension block 103a is specified, while another single position 204b between two adjacent ones of the pads 102a within the portion of the wiring area sandwiched between the block 101 and the extension block 103b is specified. Then, the wires 104a and 104b are laid across the wiring area 102 only at positions 204a and 204b, respectively.

As such, the wires 104 described in the first to fourth preferred embodiments and the wires 104a and 104b described in the fifth preferred embodiment contain a common feature in that the wires are laid across the wiring area 102 only at a single position per portion of the wiring area 102 sandwiched between the block 101 and the extension block 103 (or 103a, 103b).

The fifth preferred embodiment facilitates equalization of the respective characteristics regarding access to the RAM 302a and 302b from the circuits placed in the block 101.

Additionally, each of the pads 102a located in a portion of the wiring area 102 not sandwiched between the block 101 and the extension block 103a, 103b may be configured so as to have a function of receiving an external input signal, as described in the second preferred embodiment, of course.

<Sixth Preferred Embodiment>

Sixth and seventh preferred embodiments of the present invention will propose techniques for electrically breaking the wires 104 while no request for access from the first circuits to the second circuits is present. The techniques proposed in the sixth and seventh preferred embodiments avoid a situation in which although access to the second circuits is unnecessary, a wire capacitance is unwantedly applied to the first circuits. This improves an operation speed of the first circuits of the semiconductor device.

Figure 6:
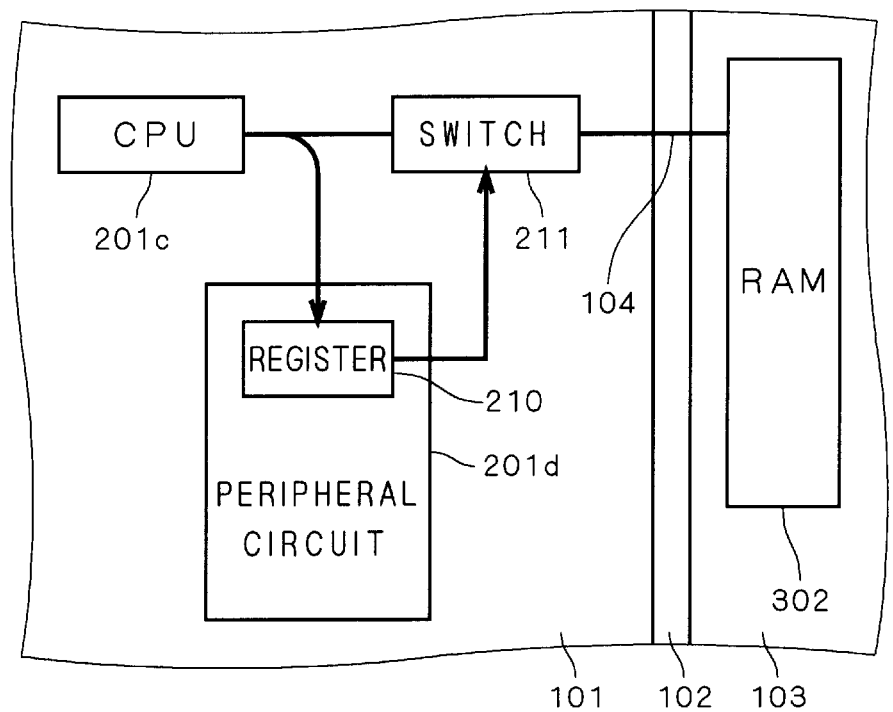
FIG. 6 illustrates a part of a structure of a semiconductor device according to a sixth preferred embodiment of the present invention.

FIG. 6 illustrates a portion of a structure of a semiconductor device according to the sixth preferred embodiment of the present invention. The block 101, the wiring area 102 and the extension block 103 shown therein are identical to those described in the first preferred embodiment. However, the sixth preferred embodiment is also applicable to any of the second to fifth preferred embodiments without any difficulty.

In the block 101, the peripheral circuit 201d includes an access permitting register 210 for permitting access to the extension block 103. The access permitting register 210 is configured so as to allow a "permit command" which is a command for permitting access to be written thereinto from the CPU 201c. The RAM 302 is provided in the extension block 103, and is connected with the CPU 201c via the wire 104.

The block 101 further includes a switch 211 placed at some midpoint in the wire 104. The switch 211 operates to electrically connect the CPU 201c and the RAM 302 with each other while the permit command is being written into the access permitting register 210. On the other hand, the switch 211 operates to break the electrical connection between the CPU 201c and the RAM 302 which is established by the wire 104 while the permit command is not being written into the access permitting register 210.

Figure 7:
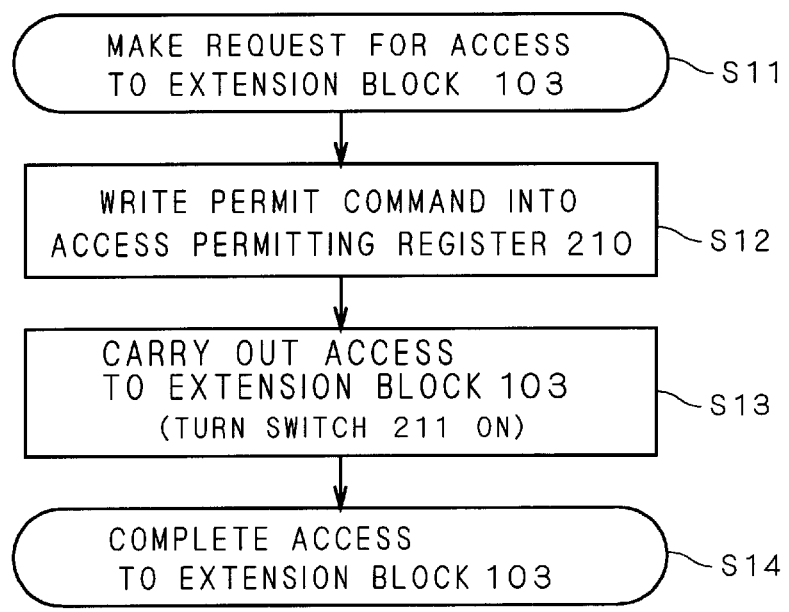
FIG. 7 is a flow chart illustrating an outline of operations according to the sixth preferred embodiment of the present invention.

FIG. 7 is a flow chart illustrating an outline of operations according to the sixth preferred embodiment of the present invention. First, a request for access to the extension block 103 is made in a step S11. Such request is made when instruction executed by the CPU 201c requires access to an address assigned to the RAM 302, for example. At the time of the request being made in the step S11, however, the electrical connection between the CPU 201c and the RAM 302 established by the wire 104 is still being broken by the switch 211.

Next, the permit command is written by the CPU 201c into the access permitting register 210 in a step S12. This writing operation turns the switch 211 ON in a step S13, so that access to the extension block 103 is carried out. For example, access to an address assigned to the RAM 302 from the CPU 201c is carried out.

Then, when the access to the extension block 103 is completed in a step S14, the permit command in the access permitting register 210 is deleted by, for example, the CPU 201c. As a result, the switch 211 breaks the electrical connection between the CPU 201c and the RAM 302 which is established by the wire 104.

<Seventh Preferred Embodiment>

Figure 8:
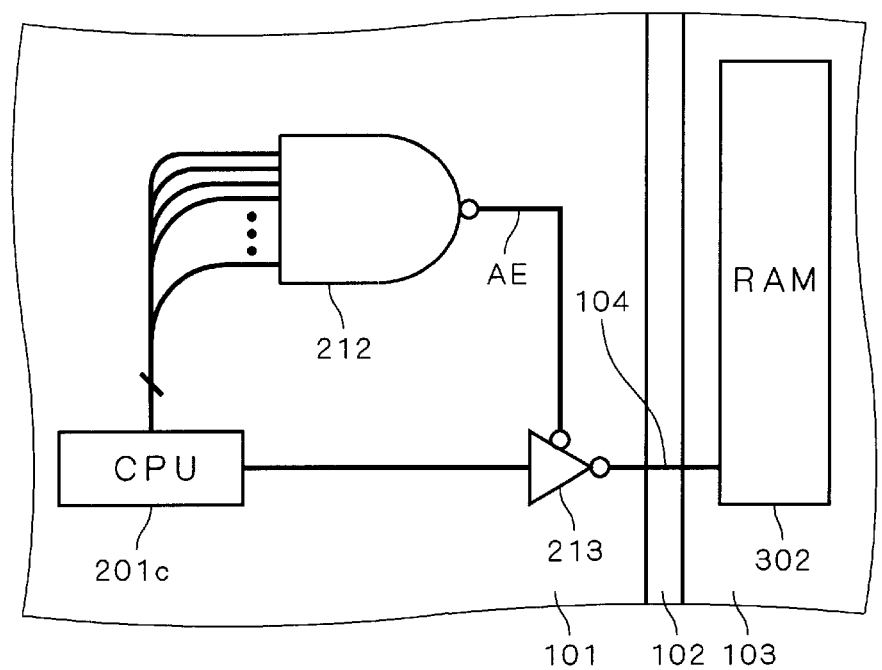
FIG. 8 illustrates a part of a structure of a semiconductor device according to a seventh preferred embodiment of the present invention.

FIG. 8 shows a portion of a structure of a semiconductor device according to the seventh preferred embodiment of the present invention. The block 101, the wiring area 102 and the extension block 103 are identical to those described in the first preferred embodiment. However, the seventh preferred embodiment is also applicable to any of the second to fifth preferred embodiments without any difficulty.

The RAM 302 placed in the extension block 103 and the CPU 201c placed in the block 101 are connected with each other via the wire 104. The block 101 further includes a gate 213 and a logic circuit 212 each placed at some midpoint in the wire 104.

An address assigned to a destination of access, which is required by instruction executed by the CPU 201c, is supplied to the logic circuit 212. If the supplied address corresponds to an address assigned to one of the second circuits, for example, the RAM 302, the gate 213 is opened, so that the RAM 302 and the CPU 201c are electrically connected with each other via the wire 104. Otherwise, if the supplied address does not have a predetermined number assigned to any of the second circuits, the gate 213 is closed, so that the electrical connection between the CPU 201c and the RAM 302 established by the wire 104 is broken.

In FIG. 8, the logic circuit 212 is exemplified by a NAND circuit, and the gate 213 is exemplified by an inverter which permits or forbids electrical connection based on a negative logic. The logic circuit 212 is provided with an address AD from the CPU 201c, and outputs a signal AE which is an active low signal. When the signal AE enters an active state, the gate 213 inverts the output from the CPU 201c and provides the inverted output to the RAM 302.

FIG. 8 illustrates an instance where an address necessary for access to the RAM 302 is formed of bits each being "1". When each of the bits of the address AD provided from the CPU 201c is "1", the signal AE enters an active state. However, the logic circuit 212 may alternatively be configured so as to allow the signal AE to enter an active state when the address AD has another predetermined number. Further, the gate 213 may alternatively be an transmission gate, not an inverter.

<Modification>

The second circuits placed in the extension block 103 (or 103a, 103b) may include a D/A converter, a timer, a serial input/output interface, a clock generating circuit and any other peripheral circuit, singly or in combination, in addition to a RAM, a ROM and an A/D converter.

Figure 9:
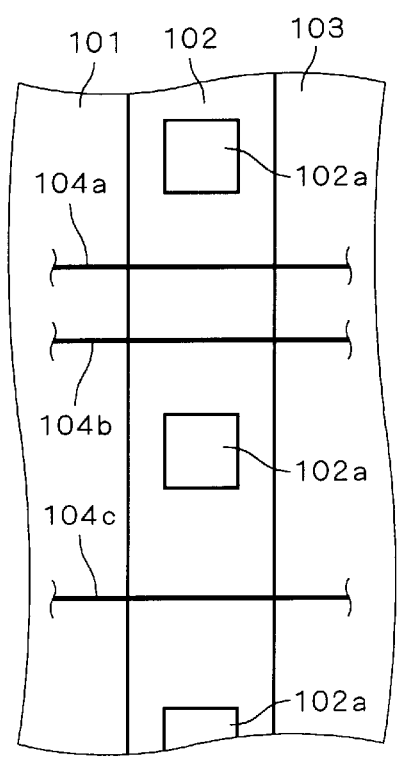
FIG. 9 illustrates a modification of the present invention.
Figure 10:
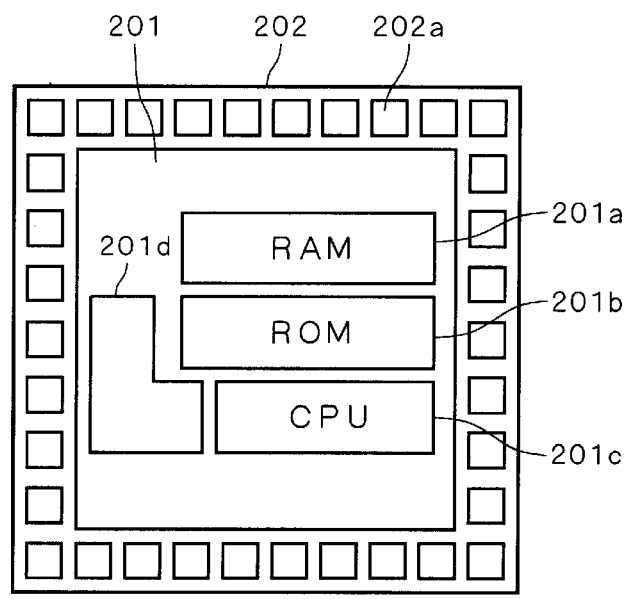
FIGS. 10 and 11 illustrate layouts of conventional semiconductor devices.
Figure 11:
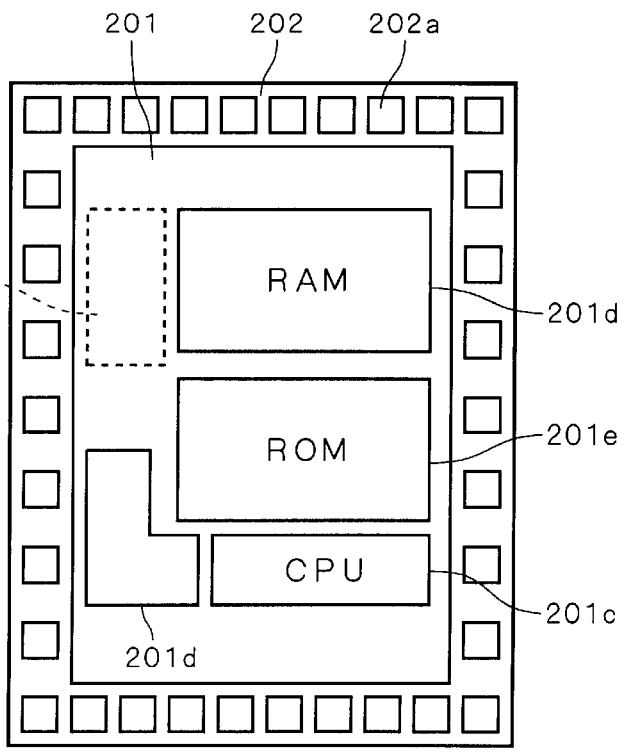

FIG. 9 shows a plurality of wires 104a, 104b and 104c which are laid across portions of the wiring area 102 between the block 101 and the extension block 103 (or 103a, 103b). In an instance illustrated by FIG. 9, the wires 104a, 104b and 104c are laid across the wiring area 102 not at a single position between two adjacent ones of the pads 102a, but at plural positions each between two adjacent ones of the pads 102a. Such layout provides for reduction of wire capacitance of the extension block 103 (or 103a, 103b).

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
    a first semiconductor region in which at least one first circuit is placed;
    a second semiconductor region in which at least one second circuit connected with said at least one first circuit is placed;
    a wiring area in which a plurality of pads connected with said at least one first circuit are arranged therein, said wiring area surrounding said first semiconductor region; and
    at least one wire laid across said wiring area at a single position between two adjacent ones of said plurality of pads per portion of said wiring area which is sandwiched between said first and second semiconductor regions, said at least one wire connecting said at least one first circuit and said at least one second circuit to each other.

2. The semiconductor device according to claim 1, wherein said at least one wire is electrically broken while no request for access to said second circuit from said first circuit is present.

3. The semiconductor device according to claim 2, wherein said first circuit comprises:
    a permitting register into which a permit command is written when a request for said access is made, said permit command being a command for permitting said access; and
    a switch for breaking electrical connection between said first and second circuits established by said wire while said command is not being written into said permitting register.

4. The semiconductor device according to claim 2, wherein said first circuit comprises a switch for breaking electrical connection between said first and second circuits established by said wire when an address necessary for said access does not have a predetermined number.

5. The semiconductor device according to claim 1, wherein
    said first semiconductor region has a substantially rectangular shape, and
    only three sides of said first semiconductor region face said second semiconductor region with said wiring area interposed therebetween.

6. The semiconductor device according to claim 5, wherein said wire is electrically broken while no request for access to said second circuit from said first circuit is present.

7. The semiconductor device according to claim 1, wherein
    said first semiconductor region has a substantially rectangular shape, and
    only one side of said first semiconductor region faces said second semiconductor region with said wiring area interposed therebetween.

8. The semiconductor device according to claim 7, wherein said wire is electrically broken while no request for access to said second circuit from said first circuit is present.

9. The semiconductor device according to claim 1, wherein
    said first semiconductor region has a substantially rectangular shape, and
    only two adjacent sides of said first semiconductor region face said second semiconductor region with said wiring area interposed therebetween.

10. The semiconductor device according to claim 9, wherein said wire is electrically broken while no request for access to said second circuit from said first circuit is present.

11. The semiconductor device according to claim 1, wherein
    said first semiconductor region has a substantially rectangular shape,
    said second semiconductor region includes a pair of separate regions, and
    only two opposite sides of said first semiconductor region face said pair of separate regions included in said second semiconductor region, respectively, with said wiring area interposed therebetween.

12. The semiconductor device according to claim 11, wherein said wire is electrically broken while no request for access to said second circuit from said first circuit is present.

* * * * *